United States Patent
Kikuchi (10) Patent No.: US 9,716,021 B2
(45) Date of Patent: Jul. 25, 2017

(54) SUBSTRATE HEAT TREATMENT APPARATUS, METHOD OF INSTALLING SUBSTRATE HEAT TREATMENT APPARATUS

(71) Applicant: Tokyo Electron Limited, Tokyo (JP)

(72) Inventor: Hiroshi Kikuchi, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 57 days.

(21) Appl. No.: 14/601,733

(22) Filed: Jan. 21, 2015

(65) Prior Publication Data

US 2015/0214081 A1   Jul. 30, 2015

(30) Foreign Application Priority Data

Jan. 27, 2014 (JP) ................... 2014-012117

(51) Int. Cl.
*H01L 21/677* (2006.01)
*H01L 21/67* (2006.01)
*B65G 1/04* (2006.01)

(52) U.S. Cl.
CPC .. *H01L 21/67109* (2013.01); *H01L 21/67769* (2013.01); *B65G 1/04* (2013.01); *H01L 21/6773* (2013.01); *Y10T 29/49826* (2015.01)

(58) Field of Classification Search
CPC ......... H01L 21/67109; H01L 21/67098; H01L 21/67769; H01L 21/67778; H01L 21/67775; H01L 21/6773; B65G 1/04
See application file for complete search history.

(56) References Cited

U.S. PATENT DOCUMENTS

| | | | | |
|---|---|---|---|---|
| 5,562,383 A | * | 10/1996 | Iwai | H01L 21/67769 118/719 |
| 6,332,744 B1 | * | 12/2001 | Fukushima | B65G 1/045 414/283 |
| 7,134,825 B1 | * | 11/2006 | Schmutz | H01L 21/67769 414/217.1 |
| 2004/0120797 A1 | * | 6/2004 | Paul | H01L 21/67265 414/217.1 |
| 2009/0053665 A1 | * | 2/2009 | Haraki | H01L 21/67769 432/1 |

(Continued)

FOREIGN PATENT DOCUMENTS

JP   2006-120658 A   5/2006

*Primary Examiner* — Glenn Myers
(74) *Attorney, Agent, or Firm* — Abelman, Frayne & Schwab (57) ABSTRACT

Disclosed is a substrate heat treatment apparatus. The apparatus includes: a conveyance storage unit which includes a first storage section and a second storage section each of which stores a plurality of conveyance containers, and a conveyance mechanism configured to convey the conveyance containers, each of the conveyance containers accommodating a plurality of wafers; and a heat treatment unit including a heat treatment furnace which accommodates a holder configured to hold the plurality of wafers in multiple stages, and performs the heat treatment on the wafers. A mounting stage of a transfer section is provided below the first storage section in the conveyance storage unit. On the mounting stage, the conveyance containers are mounted so that the wafers within the conveyance containers are transferred to the holder in the heat treatment unit.

12 Claims, 5 Drawing Sheets

(56) References Cited

U.S. PATENT DOCUMENTS

| | | | |
|---|---|---|---|
| 2009/0092940 A1* | 4/2009 | Hishiya | H01L 21/67109 432/36 |
| 2009/0143876 A1* | 6/2009 | Sugawara | G05B 9/02 700/79 |
| 2009/0238664 A1* | 9/2009 | Murata | B65G 37/02 414/222.02 |
| 2010/0202861 A1* | 8/2010 | Sawado | H01L 21/67724 414/222.02 |
| 2012/0257948 A1* | 10/2012 | Kikuchi | H01L 21/67757 414/150 |
| 2014/0086712 A1* | 3/2014 | Oyama | H01L 21/67379 414/222.01 |

* cited by examiner

SUBSTRATE HEAT TREATMENT APPARATUS, METHOD OF INSTALLING SUBSTRATE HEAT TREATMENT APPARATUS

CROSS-REFERENCE TO RELATED APPLICATIONS

This application is based on and claims priority from Japanese Patent Application No. 2014-012117, filed on Jan. 27, 2014, with the Japan Patent Office, the disclosure of which is incorporated herein in its entirety by reference.

TECHNICAL FIELD

The present disclosure relates to an apparatus for performing a heat treatment on a substrate ("substrate heat treatment apparatus"), and a method of installing the substrate heat treatment apparatus.

BACKGROUND

In manufacturing a semiconductor device, various processing apparatuses (semiconductor apparatuses) are used to perform processings such as, for example, oxidation, diffusion, chemical vapor deposition (CVD), or annealing on a processing target object, for example, a substrate such as, for example, a semiconductor wafer (hereinafter, simply referred to as a "wafer"). As one of the processing apparatuses, there is known a batch-processing type substrate heat treatment apparatus which is capable of performing a heat treatment on a plurality of wafers at once.

In the batch-processing type substrate heat treatment apparatus, a plurality of wafers is conveyed from the outside of the apparatus by a conveyance container (a carrier) (also referred to as a "FOUP") which accommodates the plurality of wafers. The conveyance container is supplied into the substrate heat treatment apparatus through, for example, a load port of the apparatus which is a carry-in/out port of the apparatus. The wafers are taken out of the supplied conveyance container and transferred to a boat (a holder) which is capable of holding the plurality of wafers at predetermined intervals in the height direction. The wafers in each boat are inserted into a heat treatment furnace and subjected to various processings.

In such a substrate heat treatment apparatus, it is requested that a processing time be reduced or a throughput be improved. In order to reduce the processing time, the substrate heat treatment apparatus is requested to store as many conveyance containers as possible, and replace the wafers held by a boat quickly whenever a processing is completed within the heat treatment furnace. Accordingly, for example, Japanese Laid-Open Patent Publication No. 2006-120658 discloses an exemplary configuration of a vertical heat treatment apparatus, which is a kind of substrate heat treatment apparatus configured to dispose many conveyance containers therein.

The apparatus disclosed in Japanese Laid-Open Patent Publication No. 2006-120658 is an apparatus that handles wafers with a diameter of 300 mm. It has recently been required to handle wafers with a diameter of 450 mm. When the wafer diameter increases in this manner, the wafer thickness also increases. Thus, the size of a conveyance container holding the wafers also increases.

Although, the size of wafers to be supplied to a substrate heat treatment apparatus increases as described above, a substrate heat treatment apparatus is requested to have a throughput equal to or higher than that of a conventional substrate heat treatment apparatus designed to handle wafers with a diameter of 300 mm, and a footprint (an occupied area) substantially equal to that of the conventional substrate heat treatment apparatus. Accordingly, the substrate heat treatment apparatus that handles wafers with a diameter of 450 mm is requested to have a footprint substantially equal to that of the conventional substrate heat treatment apparatus that handles wafers with a diameter of 300 mm, and be configured to store substantially the same number of wafers therein as that of the conventional substrate heat treatment apparatus.

SUMMARY

The present disclosure provides a substrate heat treatment apparatus. The substrate heat treatment apparatus includes: a conveyance storage unit including a first storage section and a second storage section each of which stores a plurality of conveyance containers, and a conveyance mechanism configured to convey the conveyance containers, each of the conveyance containers being configured to accommodate a plurality of wafers; and a heat treatment unit including a heat treatment furnace which accommodates a holder configured to hold the plurality of wafers in multiple stages, and performs the heat treatment on the wafers. A mounting stage of a transfer section is provided below the first storage section in the conveyance storage unit, the conveyance containers being mounted on the mounting stage so that the wafers within the conveyance containers are transferred to the holder in the heat treatment unit, and the second storage section is disposed below the conveyance mechanism adjacent to the transfer section, and includes an elevating mechanism configured to change a vertical position of the conveyance containers disposed on the second storage section.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In the configuration of the substrate heat treatment apparatus disclosed in Japanese Laid-Open Patent Publication No. 2006-120658 which handles wafers with a diameter of 300 mm, when a wafer diameter is increased to 450 mm, it was difficult to store a sufficient number of conveyance containers within the apparatus with its present footprint. That is, it was difficult to store substantially the same number of wafers within the apparatus as that of the conventional substrate heat treatment apparatus corresponding to wafers with a diameter of 300 mm.

In view of problems of the above described conventional technology, an object of the present disclosure is to provide a substrate heat treatment apparatus which is capable of storing a sufficient number of conveyance containers with the substantially same footprint as that of the substrate heat treatment apparatus corresponding to wafers with a diameter of 300 mm even when the conveyance containers accommodate wafers with a diameter of 450 mm.

In order to solve the above described problems, the present disclosure provides an apparatus for performing a heat treatment on a substrate. The substrate heat treatment apparatus includes: a conveyance storage unit including a first storage section and a second storage section each of which stores a plurality of conveyance containers, and a conveyance mechanism configured to convey the conveyance containers, each of the conveyance containers being configured to accommodate a plurality of wafers; and a heat treatment unit including a heat treatment furnace which accommodates a holder configured to hold the plurality of wafers in multiple stages, and performs the heat treatment on the wafers. A mounting stage of a transfer section is provided below the first storage section in the conveyance storage unit, the conveyance containers being mounted on the mounting stage so that the wafers within the conveyance containers are transferred to the holder in the heat treatment unit, and the second storage section is disposed below the conveyance mechanism adjacent to the transfer section, and includes an elevating mechanism configured to change a vertical position of the conveyance containers disposed on the second storage section.

In the substrate heat treatment apparatus, the elevating mechanism includes: a conveyance container support configured to support the conveyance containers; a position displacement member configured to displace a vertical position of the conveyance container support; and a guide member configured to guide a vertical movement of the conveyance container support.

In the substrate heat treatment apparatus, the position displacement member includes a ball screw.

In the substrate heat treatment apparatus, the elevating mechanism includes a conveyance container support configured to support the conveyance containers. A distance between the conveyance container support and a lower end surface of the elevating mechanism when the conveyance container support is located at a highest position is 1.2 or more times a distance between the conveyance container support and the lower end surface of the elevating mechanism when the conveyance container support is located at a lowest position.

In the substrate heat treatment apparatus, the elevating mechanism is configured to elevate a load of 50 kg or more.

In the substrate heat treatment apparatus, the conveyance mechanism holds the conveyance containers from a top side thereof to convey the conveyance containers.

The substrate heat treatment apparatus further includes a carry-in/out unit configured to carry the plurality of conveyance containers into or out of the conveyance storage unit. The carry-in/out unit includes: a first carry-in/out table and a second carry-in/out table disposed above the first carry-in/out table, the conveyance containers being mounted on the first carry-in/out table to be carried into or out of the substrate heat treatment apparatus, and the conveyance containers being mounted on the second carry-in/out table to be carried into or out of the substrate heat treatment apparatus, and a distance between a conveyance container mounting surface of the first carry-in/out table and a lower end face of the conveyance storage unit is 890 mm or more.

In the substrate heat treatment apparatus, a housing of the conveyance storage unit includes a first housing portion in which the first storage section and the conveyance mechanism are disposed, and a second housing portion below the first housing portion in which the second storage section is disposed. The housing of the conveyance storage unit is configured to be divided into at least the first housing portion and the second housing portion.

According to the present disclosure, a method of installing the substrate heat treatment apparatus includes: forming a recess on a base surface, and installing the second housing portion within the recess; and installing the first housing portion above the second housing portion.

According to the present disclosure, a substrate heat treatment apparatus is capable of storing a sufficient number of conveyance containers with the substantially same footprint as that of a substrate heat treatment apparatus corresponding to wafers with a diameter of 300 mm even when the conveyance containers accommodate wafers with a diameter of 450 mm.

Hereinafter, exemplary embodiments of the present disclosure will be described with reference to drawings, but the present disclosure is not limited to the exemplary embodiments as described below. Various modification and substitutions may be made in the exemplary embodiments without departing from the scope of the present disclosure.

In the present exemplary embodiment, an exemplary configuration of a substrate heat treatment apparatus will be described. In the present exemplary embodiment, as for a substrate heat treatment apparatus, a vertical heat treatment apparatus is exemplified, but the present disclosure is not limited thereto.

The vertical heat treatment apparatus of the present exemplary embodiment may include a conveyance storage unit and a heat treatment unit.

The conveyance storage unit may include a first storage section and a second storage section configured to store a plurality of conveyance containers, each of which accommodates a plurality of wafers, and a conveyance mechanism configured to convey the conveyance containers.

The heat treatment unit may include a heat treatment furnace which accommodates a holder that holds a plurality of wafers in multiple stages, and performs a heat treatment on the wafers.

A mounting stage of a transfer section may be provided below the first storage section in the conveyance storage unit. On the mounting stage, conveyance containers are mounted to transfer wafers within the conveyance containers to the holder in the heat treatment unit. The second storage section may be disposed below the conveyance mechanism to be adjacent to the transfer section, and includes an elevating mechanism configured to change a vertical position of the conveyance containers disposed on the second storage section.

Figure 1:
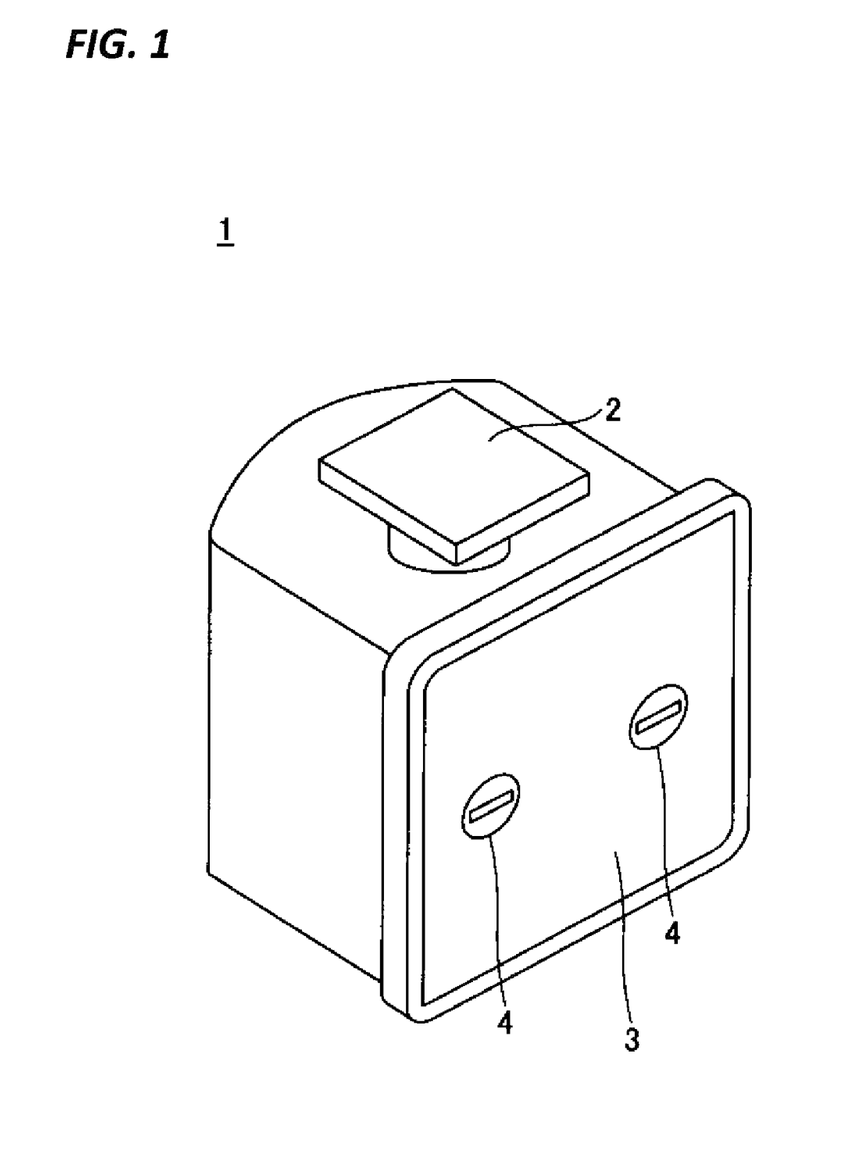
FIG. 1 is a schematic perspective view of a conveyance container.

First, descriptions will be made on an exemplary configuration of a conveyance container used for conveying and storing wafers in a vertical heat treatment apparatus of an exemplary embodiment, with reference to FIG. 1. FIG. 1 illustrates a schematic perspective view of an exemplary conveyance container of wafers. Meanwhile, a conveyance container configured to accommodate wafers in the present exemplary embodiment is a sealed-type front opening unified pod (FOUP), but the present disclosure is not limited thereto.

The conveyance container is also referred to as a carrier. As illustrated in FIG. 1, one end of a conveyance container 1 may be formed as an opening, and the other end may be formed in, for example, a substantially semi-elliptic shape.

A support section is formed on the inner wall surface of the conveyance container 1. On the support section, wafers may be disposed in multiple stages. The peripheries of the wafers may be mounted and supported on the support section so that the wafers may be accommodated at substantially equal pitches in multiple stages. In general, one conveyance container may accommodate 25 wafers.

A handle 2 is provided on the ceiling of the conveyance container 1. The handle 2 may be grasped when the conveyance container 1 is held.

An open/close lid 3 corresponding to the opening is detachably attached to the opening of the conveyance container 1. The inside of the conveyance container 1 is mounted in a substantially airtight state by the open/close lid 3. In general, the inner atmosphere of the conveyance container is a clean air.

For example, two lock mechanisms 4 are provided in the open/close lid 3. The open/close lid 3 may be attached and detached to/from the opening by locking or unlocking the lock mechanisms 4.

A plurality of positioning recesses (not illustrated) may be formed on the bottom surface of the base portion of the conveyance container 1. When the positioning recesses are formed, the conveyance container 1 may be positioned by protrusions formed on, for example, the mounting stage and the positioning recesses formed on the conveyance container 1 when the conveyance container 1 is conveyed within the vertical heat treatment apparatus and mounted on, for example, the mounting stage. Alternatively, lock pieces (not illustrated) may be provided on the bottom surface of the base portion of the conveyance container 1 so that the conveyance container 1 may be locked when it is mounted on a mounting stage 123a of a transfer section 123 as described below.

As described above, in the vertical heat treatment apparatus, the diameter of wafers to be supplied for processings has conventionally been 300 mm, but is recently required to be 450 mm. As the wafer diameter increases, the wafer thickness also increases from, for example, 0.725 mm (a conventional thickness) to 0.925 mm. Accordingly, a conveyance container accommodating 25 wafers therein has a height of about 339 mm when the conveyance container is designed to accommodate wafers with a diameter of 300 mm, but has an increased height of about 404 mm when the conveyance container is designed to accommodate wafers with a diameter of 450 mm.

Meanwhile, in the present disclosure, a wafer with a diameter of 450 mm includes all wafers which are recognized as those having a diameter of 450 mm by a person skilled in the art of semiconductor apparatus. Accordingly, the wafers with a diameter of 450 mm are not strictly limited to wafers having a diameter of 450 mm but may include wafers having a diameter slightly deviated from 450 mm, for example, a diameter of 450±0.2 mm.

Therefore, the inventors have completed the present disclosure through an examination performed on a configuration within a vertical heat treatment apparatus in order to store a sufficient number of conveyance containers in the vertical heat treatment apparatus while maintaining the footprint to be substantially the same as that of a vertical heat treatment apparatus handling wafers with a diameter of 300 mm, even when the diameter of the wafers is 450 mm.

Hereinafter, the configuration of the vertical heat treatment apparatus according to the present exemplary embodiment will be described in detail with reference to FIGS. 2A and 2B.

Figure 2A:
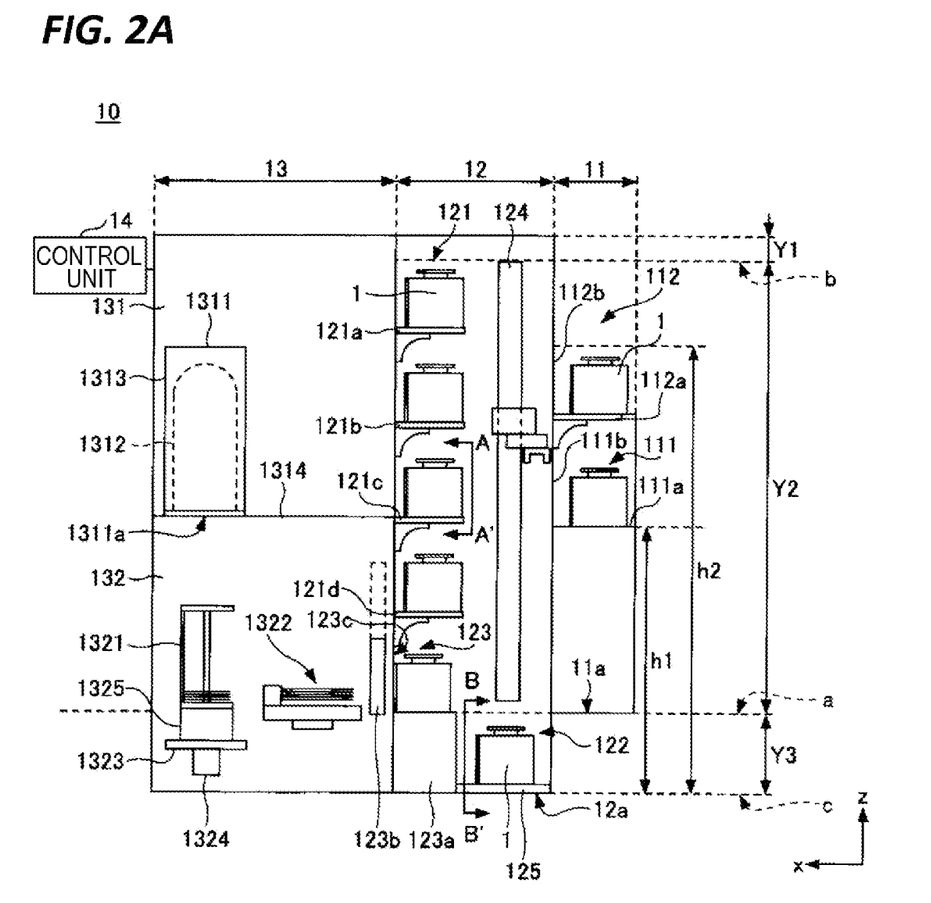
FIGS. 2A and 2B are schematic explanatory views of a vertical heat treatment apparatus according to an exemplary embodiment of the present disclosure.
Figure 2B:
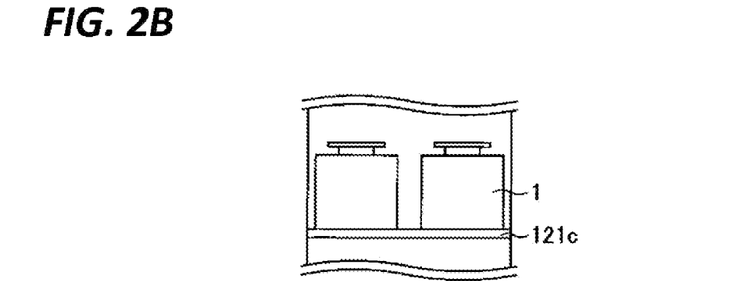

FIG. 2A illustrates a schematic cross-sectional view of the vertical heat treatment apparatus according to the present exemplary embodiment, and FIG. 2B illustrates a cross-sectional view taken along A-A' line in FIG. 2A.

As illustrated in FIG. 2A, a vertical heat treatment apparatus 10 of the present exemplary embodiment may include a conveyance storage unit 12, and a heat treatment unit 13 arranged to be aligned in the horizontal direction in the drawing. Each unit will be described below.

(Conveyance Storage Unit)

The conveyance storage unit 12 may include a first storage section 121 and a second storage section 122 each of which stores a plurality of conveyance containers 1. Meanwhile, as described above, each of the plurality of conveyance containers 1 may accommodate a plurality of wafers therein. The conveyance storage unit 12 may include a mounting stage 123a of a transfer section 123 on which the conveyance containers 1 are mounted so as to transfer the wafers within the conveyance containers 1 to a holder 1321 of the heat treatment unit 13. The conveyance storage unit 12 may include a conveyance mechanism 124 configured to convey the conveyance containers 1 among the first storage section 121, the second storage section 122, the transfer section 123, and for example, a carry-in/out unit 11 to be described later.

As illustrated in FIG. 2A, the first storage section (a first carrier stage) 121 may be disposed on one selected wall portion of the conveyance storage unit 12. For example, the first storage section 121 may be disposed on a wall portion of the conveyance storage unit 12 which faces the heat treatment unit 13.

As illustrated in FIG. 2A, the first storage section 121 includes a plurality of stages of mounting shelves 121a to 121d, and two conveyance containers 1 may be disposed on each of the mounting shelves.

Here, FIG. 2B illustrates the configuration of the mounting shelf 121c, which is one of the plurality of stages of mounting shelves, in which the conveyance containers 1 are disposed on the top surface of the mounting shelf 121c. FIG. 2B corresponds to a cross-sectional view taken along A-A' line in FIG. 2A. As illustrated in FIG. 2B, two conveyance containers 1 may be disposed on the top of each of the mounting shelves. Accordingly, as illustrated in FIG. 2A, when the first storage section 121 includes four stages of mounting shelves and conveyance containers 1 are disposed on all the mounting shelves, a total of eight conveyance containers 1 may be disposed in the first storage section 121.

In FIG. 2A, the number of stages of mounting shelves in the first storage section 121 is four (4). However, the number of stages is not limited to four, but may be changed according to a device size or the required number of the conveyance containers 1 to be provided. In order to increase the throughput of the vertical heat treatment apparatus, wafers for the next batch, or multiple types of dummy wafers may be kept within the vertical heat treatment apparatus 10. Accordingly, when, for example, the number of wafers to be carried into a heat treatment furnace 1311 (to be described later) at once is in a range of about 100 to 125, the first storage section 121 may include four or more stages. Meanwhile, the vertical heat treatment apparatus 10 is generally provided within a clean room, and thus its height may be restricted by the height of the clean room. Accordingly, for example, the number of stages in the first storage section 121 may be selected according to the height of the clean room.

As illustrated in FIG. 2A, the second storage section (a second carrier stage) 122 may be provided below the conveyance mechanism 124 to be adjacent to the transfer section 123. Meanwhile, in the present exemplary embodiment, a lower side refers to a downward direction in view of the height direction [the z-axis direction in FIG. 2A] irrespective of a position in the horizontal direction [the x-axis direction in FIG. 2A or the direction perpendicular to paper sheet]. Here, as described above, the second storage section 122 may be disposed at a location adjacent to the transfer section 123 in view of the horizontal direction, that is, the x-axis direction in FIG. 2A. The second storage section 122 may be disposed such that the conveyance mechanism 124 and at least a part of the second storage section 122 overlap each other when the lower side in the height direction [the z-axis direction in FIG. 2A], that is, the second storage section 122 side is viewed from the conveyance mechanism 124 side. Particularly, the second storage section 122 may be disposed just below the conveyance mechanism 124.

As in the first storage section 121, two conveyance containers 1 may be disposed in the second storage section 122 to be aligned in the direction perpendicular to paper sheet in FIG. 2A.

In the vertical heat treatment apparatus 10 of the present exemplary embodiment, the position of the transfer section 123 may be reconsidered so that the second storage section 122 may be provided below the conveyance mechanism 124 as described above. Thus, a sufficient number of conveyance containers 1 may be stored within the vertical heat treatment apparatus 10 without increasing the footprint.

When the conveyance container 1 is mounted on the second storage section 122, the height of the top portion of the conveyance container 1 mounted on the second storage section 122 may be lower than the height of the mounting stage 123a of the transfer section 123 so as not to inhibit the conveyance container 1 from being carried into or out of the transfer section 123. However, the conveyance mechanism 124 has a limited driving area. Thus, when the height of the second storage section 122 is excessively low, the second storage section 122 may not be used.

Therefore, in the vertical heat treatment apparatus 10 of the present exemplary embodiment, the second storage section 122 may include an elevating mechanism 125 configured to change the vertical position of the conveyance containers 1 mounted on the second storage section 122.

The configuration of the elevating mechanism 125 is not particularly limited as long as the elevating mechanism 125 may change the vertical position of the conveyance containers 1 while the conveyance containers 1 are mounted on the second storage section 122.

The elevating mechanism 125 may include a conveyance container support 32 or 52 configured to support the conveyance containers 1 [in relation to respective members of the elevating mechanism, such as the conveyance container support 32 or 52, see FIGS. 3A to 5B to be described later]. In order to minimize the vertical size required for the second storage section 122, a displacement width of the height of the conveyance container support 32 or 52 supporting the conveyance containers 1 between the highest position and the lowest position of the conveyance container support 32 or 52 may be large.

For example, the distance between the conveyance container support 32 or 52 and the lower end surface of the elevating mechanism 125 when the conveyance container support 32 or 52 is located at the highest position (hereinafter, referred to as a "maximum height") may be 1.2 or more times the distance between the conveyance container support 32 or 52 and the lower end surface of the elevating mechanism 125 when the conveyance container support 32 or 52 is located at the lowest position (hereinafter, referred to as a "minimum height"). Particularly, the maximum height of the conveyance container support 32 or 52 may be 1.5 or more times the minimum height or may be twice or more the minimum height.

When the ratio of the maximum height to the minimum height of the conveyance container support 32 or 52 falls within the above described range, not only the conveyance containers 1 mounted on the second storage section 122 may be suppressed from interfering with, for example, conveyance of the conveyance containers 1 into the transfer section 123, but also the conveyance containers 1 mounted on the second storage section 122 may be reliably held by the conveyance mechanism 124.

Even when the height of the mounting stage 123a of the transfer section 123 is low, the conveyance containers 1 mounted on the second storage section 122 may be suppressed from interfering with, for example, conveyance of the conveyance containers 1 into the transfer section 123. Thus, it is possible to sufficiently secure the space for the first storage section 121 to be disposed above the transfer section 123.

The upper limit of the ratio of the maximum height to the minimum height of the conveyance container support 32 or 52 is not particularly limited but does not need to be larger than necessary with respect to the size of the vertical heat treatment apparatus. For example, the maximum height of the conveyance container support 32 or 52 may be three times or less the minimum height. Particularly, the maximum height of the conveyance container support 32 or 52 may be 2.1 or less times the minimum height.

As described above, the second storage section 122 may store two conveyance containers 1. Accordingly, the elevating mechanism 125 may be configured to be movable in the height direction [the z-axis direction in FIG. 2A] in a state where the two conveyance containers 1 are mounted. Since one conveyance container 1 accommodating 25 wafers with a diameter of 450 mm may generally have a mass of about 24 kg, the elevating mechanism 125 may preferably elevate a load of 50 kg or more and more preferably of 60 kg or more. The upper limit of load-bearing of the elevating mechanism 125 is not particularly limited, but the elevating mechanism 125 does not need to have a capacity greater than necessary. Thus, the upper limit may be 100 kg or less.

The elevating mechanism 125 may be provided independently for each of the conveyance containers 1. Accordingly, as described above, when the second storage section 122 is configured to store two conveyance containers 1, two independent elevating mechanisms 125 may be disposed according to the configuration. When the elevating mechanism 125 is provided for each of the conveyance containers 1, the elevating mechanism 125 only has to elevate one conveyance container. Thus, the elevating mechanism 125 may preferably elevate a load of 25 kg or more, and more preferably of 30 kg or more. Even in a case where the elevating mechanism 125 is provided for each of the conveyance containers 1, the upper limit of load-bearing of the elevating mechanism 125 is not particularly limited, but may be 50 kg or less.

A specific configuration of the elevating mechanism 125 is not particularly limited. The elevating mechanism 125 may be configured to hold the conveyance containers 1 and stably change the vertical position of the conveyance containers 1. Accordingly, the elevating mechanism 125 may include the conveyance container support 32 or 52 configured to support the conveyance containers 1, a position displacement member (a position displacement member for the conveyance container support) 31 or 51 configured to displace the vertical position of the conveyance container support 32 or 52, and a guide member configured to guide the vertical movement of the conveyance container support 32 or 52.

The shape of the conveyance container support 32 or 52 is not particularly limited. For example, a plate-like body may be used. A material for the conveyance container support 32 or 52 is not particularly limited. For example, various metals such as, for example, an aluminum alloy may be used. The conveyance container support 32 or 52 may be subjected to any processing in advance so that the position displacement member 31, or 51 or the guide member 33 or 53 may be provided. Positioning protrusions may be provided on a conveyance container mounting surface of the conveyance container support 32 or 52. The positioning protrusions allow the conveyance containers 1 to be positioned when the conveyance containers 1 are mounted. Due to the positioning protrusions provided on the conveyance container mounting surface, the conveyance containers 1 may be positioned by the positioning protrusions and the positioning recesses formed on the bottom surface of each of the conveyance containers 1. Also, a lock unit configured to fix the conveyance containers 1 may be provided on the conveyance container mounting surface of the conveyance container support 32 or 52.

The position displacement member is not particularly limited, but may include for example, a ball screw, Zip Chain Actuator (registered trademark) or a cylinder. Especially, as described above, in order to increase the ratio of the maximum height to the minimum height of the conveyance container support 32 or 52, the position displacement member may include the ball screw or the Zip Chain Actuator. The position displacement member may include the ball screw because the ball screw is a simple mechanism and requires a low cost.

The guide member is not particularly limited as long as it is capable of guiding the vertical movement of the conveyance container support 32 or 52. For example, a linear motion (LM) guide or a pantograph-type extensible frame may be used.

A specific exemplary configuration of the elevating mechanism 125 will be described with reference to FIGS. 3A to 5B.

Figure 3A:
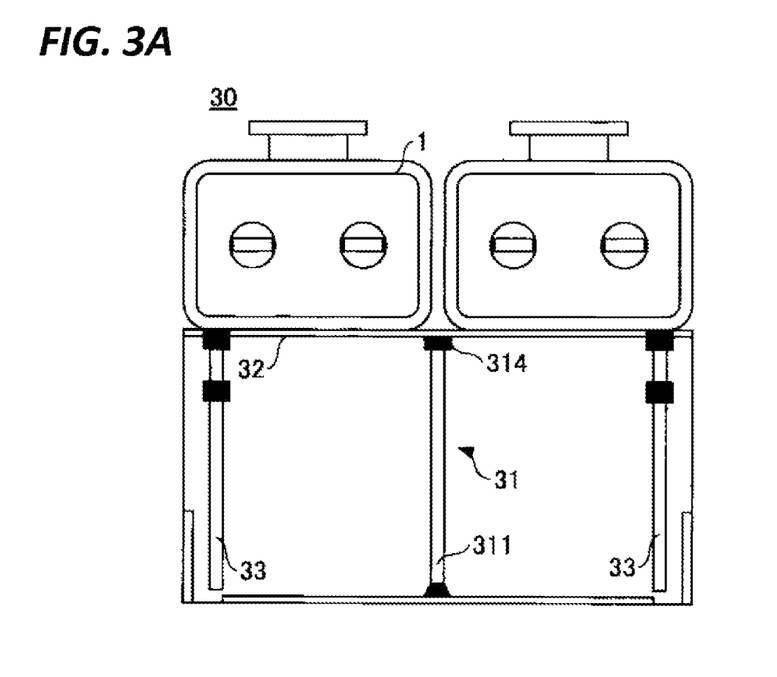
FIGS. 3A and 3B are explanatory views of an exemplary configuration of an elevating mechanism of the vertical heat treatment apparatus according to an exemplary embodiment of the present disclosure.
Figure 3B:
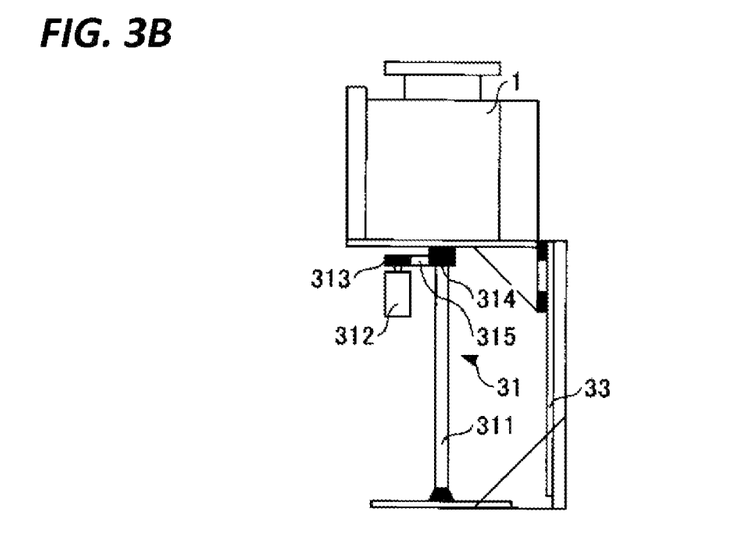
Figure 4A:
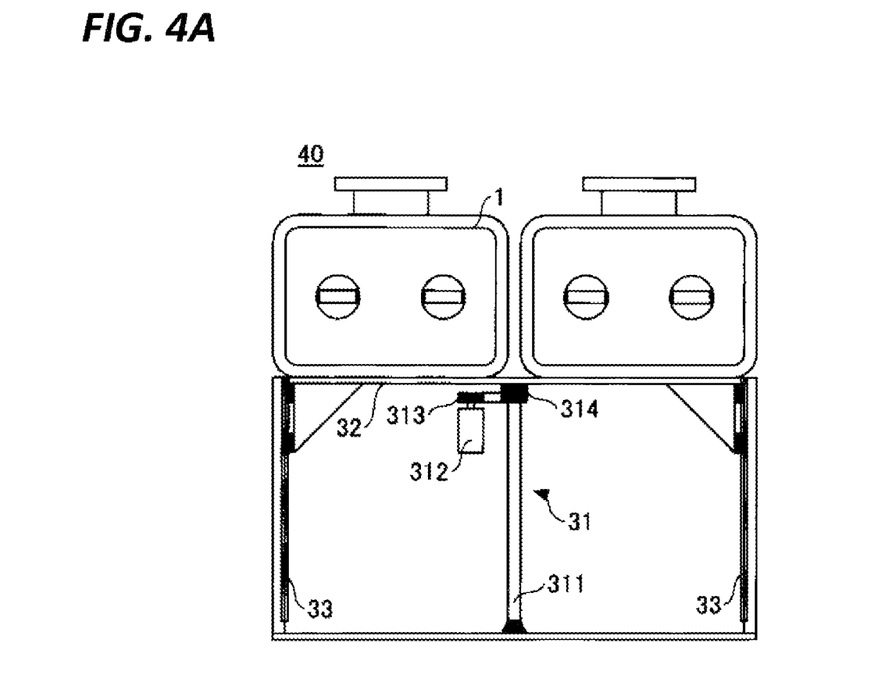
FIGS. 4A and 4B are explanatory views of an exemplary configuration of an elevating mechanism of the vertical heat treatment apparatus according to an exemplary embodiment of the present disclosure.
Figure 4B:
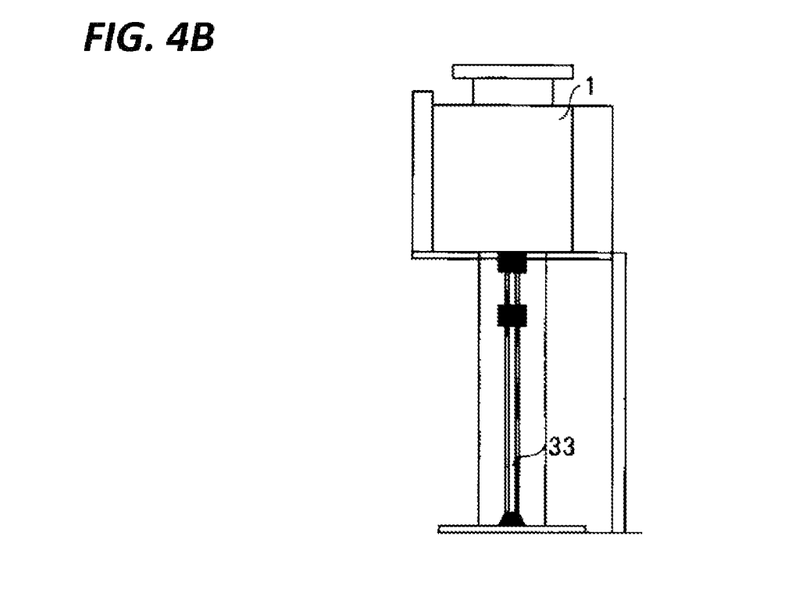

FIGS. 3A to 4B illustrate an example where the position displacement member 31 includes a ball screw 311, and an LM guide is used as a guide member 33. FIGS. 3A and 4A illustrate cross-sectional views of FIG. 2A taken along B-B' plane, and FIGS. 3B and 4B illustrate side views of FIG. 2A when the second storage section 122 including the elevating mechanism 125 is viewed in the direction perpendicular to paper sheet. When FIG. 2A is compared to FIGS. 3A to 4B and FIGS. 5A and 5B to be described later, for example, sizes of the conveyance container supports are slightly different from each other. This is because the members are schematically illustrated for easy understanding of the configuration of the apparatus. For example, the size of each member within the apparatus is not limited to that illustrated in the drawings. All FIGS. 3A to 4B illustrate a state where the conveyance container support 32 is located at the highest position.

Each of elevating mechanisms 30 and 40 illustrated in FIGS. 3A and 3B, and FIGS. 4A and 4B includes the ball screw 311 as the position displacement member 31. The position displacement member 31 has a structure where a belt 315 is wound between a nut portion 314 of the ball screw 311 and a pulley 313 mounted on the shaft of a motor 312. Accordingly, the rotary motion of the motor 312 may be converted into a linear motion by the ball screw 311 so as to displace the conveyance container support 32 in the height direction.

FIGS. 3A and 3B illustrate an example where two LM guides as the guide members 33 are provided along the arrangement direction of the conveyance containers 1. But the present disclosure is not limited thereto. Two or more guide members 33 may be disposed. As in the elevating mechanism 40 illustrated in FIGS. 4A and 4B, the guide members 33 may be provided on two planes perpendicular to the arrangement direction of the conveyance containers 1, respectively. Each of the guide members 33 may be provided so as not to cause deflection in the conveyance container support 32. Accordingly, when the LM guides are used as the guide members 33, the LM guides may be disposed along the arrangement direction of the conveyance containers 1, that is, along the long side of the conveyance container support 32 as illustrated in FIG. 3A. Here, in the illustrated example, the LM guide is used as each of the guide members 33, but the present disclosure is not limited to thereto. A pantograph-type extensible frame to be described later or other guide members may be used.

Figure 5A:
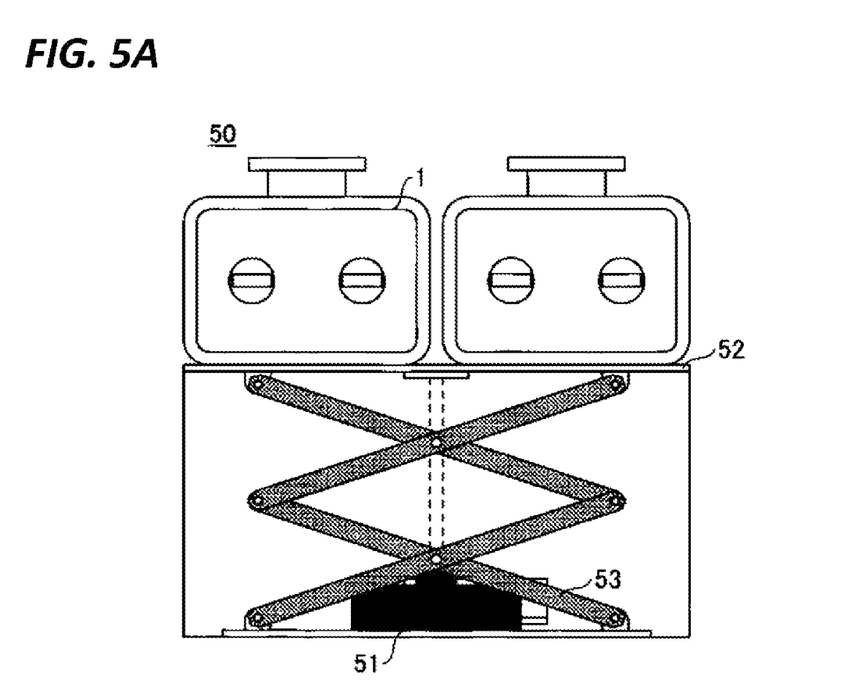
FIGS. 5A and 5B are explanatory views of an exemplary configuration of an elevating mechanism of the vertical heat treatment apparatus according to an exemplary embodiment of the present disclosure.
Figure 5B:
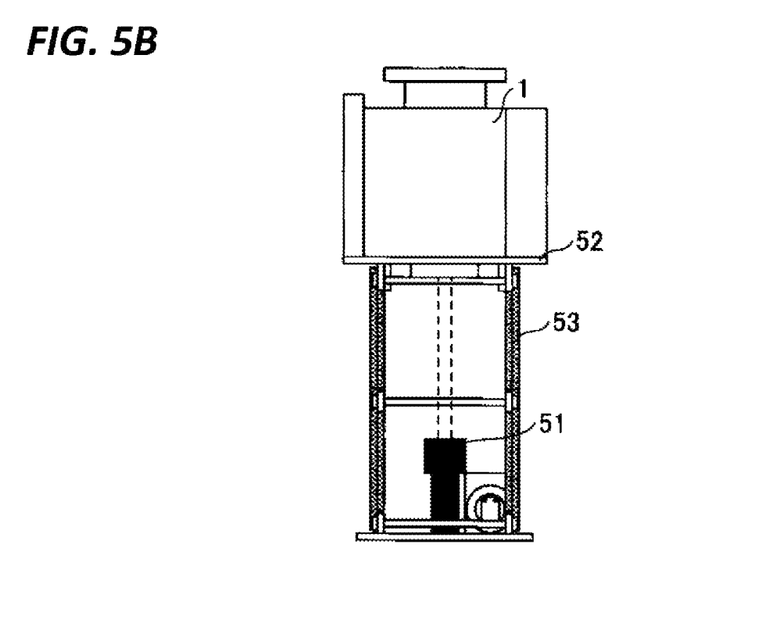

FIGS. 5A and 5B illustrate an exemplary configuration of an elevating mechanism 50, in which the position displacement member 51 includes a zip chain actuator, and a pantograph-type extensible frame is used as the guide member 53. FIG. 5A illustrates a cross-sectional view of FIG. 2A taken along B-B' plane, and FIG. 5B illustrates a side view of FIG. 2A when the second storage section 122 including the elevating mechanism 125 is viewed in the direction perpendicular to paper sheet. Both FIGS. 5A and 5B illustrate a state where the conveyance container support 52 is located at the highest position.

The elevating mechanism 50 illustrated in FIGS. 5A and 5B includes the zip chain actuator as the position displacement member 51. The zip chain actuator indicates a member which uses two chains (not illustrated). The two chains are processed in shape so that their opposing surfaces are engaged with each other. The zip chain actuator extends by engaging the two chains with each other, and contracts by disengaging the two chains from each other. The two engaged chains described above may extend in the portion indicated by the dotted line in the drawing so as to displace the height of the conveyance container support 52.

In FIG. 5, as the guide member 53, the pantograph-type extensible frame is used. However, as illustrated in FIGS. 3A to 4B, an LM guide or other guide members may be used.

Hereinafter, the transfer section 123 will be described. The transfer section 123 is also referred to as a FIMS port, and includes the mounting stage 123a on which the conveyance containers 1 are mounted. On the mounting stage 123a of the transfer section 123, the conveyance containers 1 may be placed when the wafers are transferred from the conveyance container 1 into the holder 1321 or transferred from the holder 1321 into the conveyance container 1. The holder 1321 is configured to supply a plurality of wafers into the heat treatment furnace 1311 to be described later.

The transfer section 123 may be disposed below the first storage section 121, for example, as illustrated in FIG. 2A. The transfer section 123 may be disposed such that the first storage section 121 and at least a part of the transfer section 123 overlap each other when the lower side in the z-axis direction (the height direction) in FIG. 2A, that is, the transfer section 123 side is viewed from the first storage section 121 side. In particular, the transfer section 123 may be disposed just below the first storage section 121.

The transfer section 123 may include: an opening that causes the inside of a loading area 132 within the heat treatment unit 13 (described below) to communicate with the inside of a conveyance container 1; and a door mechanism 123b which is capable of being opened/closed and is configured to seal the opening from the loading area 132 side. The transfer section 123 may also include a lid open/close mechanism (not illustrated) configured to open and close the open/close lid 3 of the conveyance container 1.

A positioning protrusion may be formed on the mounting stage 123a so as to perform positioning a conveyance container 1 when the conveyance container 1 is disposed on the mounting stage 123a. A lock unit may be disposed on the mounting stage 123a to fix the conveyance container 1 in a state where the front periphery of the body of the container is in contact with a partition wall 123c of the conveyance storage unit 12 when the conveyance container 1 is disposed on the mounting stage 123a. The partition wall 123c faces the heat treatment unit 13.

The transfer section 123 may also be configured such that two conveyance containers 1 may be disposed in the direction perpendicular to paper sheet. In this case, for example, the opening, the door mechanism 123b, or the lid open/close mechanism as described above may also be disposed at two locations in the direction perpendicular to paper sheet to correspond the mounting locations of the conveyance containers 1 so that the wafers may be transferred to/from the two conveyance containers 1 at once.

Meanwhile, the number of the conveyance containers 1 which can be disposed on the transfer section 123 is not limited to two, but may be optionally changed. For example, when it is required to dispose three or more conveyance containers 1 on the transfer section 123, the lowermost mounting shelf 121d in the first storage section 121 may also serve as the transfer section 123. In this case, for example, the opening, the door mechanism 123b, or the lid open/close mechanism as described above may also be provided to correspond to the conveyance containers 1 disposed on the mounting shelf 121d.

The transfer section 123 may also be used as a storage unit (a third storage unit) configured to temporarily store the conveyance containers 1 according to, for example, a situation where the wafers are transferred between the holder 1321 and the conveyance container 1.

The conveyance mechanism 124 may be configured to convey the conveyance containers 1.

The conveyance mechanism 124 may convey the conveyance container 1 between the conveyance storage unit 12 and the outside of the conveyance storage unit 12. Specifically, for example, the conveyance mechanism 124 may convey the conveyance containers 1 carried out of the carry-in/out unit 11 (described later) to the first storage section 121, the second storage section 122, and the transfer section 123. Also, the conveyance mechanism 124 may carry the conveyance containers 1 accommodating wafers processed in the heat treatment unit 13 into the carry-in/out unit 11.

The conveyance mechanism 124 may also convey the conveyance containers 1 within the conveyance storage unit 12. Specifically, the conveyance mechanism 124 may convey the conveyance container 1 among the first storage section 121, the second storage section 122, and the transfer section 123.

The specific configuration of the conveyance mechanism 124 is not particularly limited as long as the conveyance mechanism 124 can convey a conveyance container 1. It is preferable that the conveyance mechanism 124 is configured to hold the conveyance containers 1 from the top surface side thereof to convey the conveyance containers 1. For example, since the second storage section 122 is disposed below the conveyance mechanism 124, it is preferable that the conveyance containers 1 are held from the top side when the conveyance containers 1 are carried into or out of the second storage section 122. As for a conveyance mechanism capable of holding the conveyance containers 1 from the top side and conveying the conveyance containers 1, an automation flange may be properly used.

(Heat Treatment Unit)

As described above, the heat treatment unit 13 may include a heat treatment furnace 1311 configured to accommodate a holder 1321 which holds a plurality of wafers in multiple stages and to perform a heat treatment on the wafers.

The heat treatment unit 13 may include a heat treatment furnace area 131 in which the heat treatment furnace 1311 is disposed, and a loading area 132 where wafers are transferred between a conveyance container 1 and the holder 1321 so that the wafers are supplied into the heat treatment furnace 1311 or the wafers processed in the heat treatment furnace 1311 are carried out of the heat treatment furnace 1311.

As illustrated in FIG. 2A, the heat treatment furnace area 131 may be disposed above the loading area 132. The heat treatment furnace 1311 is disposed in the heat treatment furnace area 131. The heat treatment furnace 1311 may include a reaction tube 1312 which is a vertically long processing container and a heater 1313 disposed to cover the periphery of the reaction tube 1312. The base portion of the reaction tube 1312 is opened as a furnace opening 1311a. The configuration of the heater 1313 is not particularly limited, but a heater capable of heating the inside of the reaction tube 1312 to a temperature ranging from, for example, 300° C. to 1200° C. may be used.

The reaction tube 1312 may be made of, for example, quartz, and connected to a plurality of gas introducing tubes configured to introduce a processing gas or an inert gas for purging into the reaction tube 1312, or an exhaust tube including, for example, a vacuum pump or a pressure control valve which is configured to control the pressure inside of the reaction tube. A furnace opening 1311a may be formed in the bottom side of the reaction tube 1312. Through the furnace opening 1311a, wafers may be inserted.

The reaction tube 1312 or the heater 1313 may be disposed on a base plate 1314. An opening may be formed in the base plate 1314 so that, for example, the holder 1321 holding the wafers may be carried into or out of the opening from/to the lower side in the drawing. The base plate 1314 may be made of, for example, stainless steel.

For example, the holder 1321 may be provided in the loading area 132 to transfer the wafers within the conveyance containers 1 mounted on the mounting stage 123*a* of the transfer section 123 of the conveyance storage unit 12.

Specifically, for example, as illustrated in FIG. 2A, a transfer mechanism 1322 may be disposed to transfer the wafers between the conveyance containers 1 placed on the transfer section 123 and the holder 1321. Meanwhile, the transfer mechanism 1322 may transfer the wafers from the conveyance container 1 to the holder 1321 so as to supply the wafers into the heat treatment furnace 1311. Also, after the heat treatment on the wafers is completed, the transfer mechanism 1322 may transfer the wafers from the holder 1321 to the conveyance container 1.

The holder 1321 is also referred to as a boat, and may hold a plurality of wafers in a shelf form. The holder 1321 is mounted on a lid 1323 through a heat insulation member (a heat insulation tube) 1325.

The lid 1323 is supported by an elevating mechanism (not illustrated), and is raised by the elevating mechanism to seal the furnace opening 1311*a* of the heat treatment furnace 1311. The holder 1321 mounted on the lid 1323 may be carried into or out of the heat treatment furnace 1311 by the elevating mechanism.

A rotation mechanism 1324 may be provided so that the holder 1321 mounted on the lid 1323 is rotatable within the heat treatment furnace 1311 to rotate the wafers in the horizontal plane.

A shutter (not illustrated) may be disposed in the loading area 132 to shut the furnace opening 1311*a* when the holder 1321 or the lid 1323 is lowered.

As illustrated in FIG. 2A, the vertical heat treatment apparatus 10 of the present exemplary embodiment may further include the carry-in/out unit 11 to carry a plurality of conveyance containers 1 into or out of the conveyance storage unit 12. Hereinafter, the exemplary configuration of the carry-in/out unit 11 will be described.

(Carry-In/Out Unit)

The carry-in/out unit 11 may be disposed adjacent to the conveyance storage unit 12, and may be configured to carry the conveyance containers 1 into or out of the vertical heat treatment apparatus 10, in which each of the conveyance containers 1 accommodates a plurality of wafers.

The configuration of the carry-in/out unit 11 is not particularly limited. For example, as illustrated in FIG. 2A, two stages of load ports including a lower load port 111 and an upper load port 112 may be disposed. Each load port may include a table on which conveyance containers 1 are mounted, and an opening through which the conveyance containers 1 are carried into or out of the conveyance storage unit 12.

Specifically, the lower load port 111 may include a first carry-in/out table 111*a* on which conveyance containers 1 are mounted and a first opening 111*b*.

The upper load port 112 may include a second carry-in/out table 112*a* on which the conveyance containers 1 are mounted and a second opening 112*b* through which the conveyance containers 1 are carried into or out of the conveyance storage unit 12. In each of the first carry-in/out table 111*a* and the second carry-in/out table 112*a*, two conveyance containers 1 may be disposed in the direction perpendicular to paper sheet as in, for example, the first storage section 121.

The conveyance containers 1 carried into the first carry-in/out table 111*a* and the second carry-in/out table 112*a* may be conveyed to, for example, the first storage section 121, the second storage section 122, or the mounting stage 123*a* of the transfer section 123 within the conveyance storage unit 12 by the conveyance mechanism 124 of the conveyance storage unit 12. The conveyance containers 1 accommodating the wafers processed in the heat treatment unit 13 may be discharged to the first carry-in/out table 111*a* or the second carry-in/out table 112*a*.

Meanwhile, the first carry-in/out table 111*a* or the second carry-in/out table 112*a* may also be used as a storage unit (a fourth storage unit) configured to temporarily store the conveyance containers 1 according to carrying-in/out of the conveyance containers 1.

A unit for conveying the conveyance containers 1 accommodating wafers into the first carry-in/out table 111*a* or the second carry-in/out table 112*a*, from the outside of the vertical heat treatment apparatus is not particularly limited. For example, an overhead hoist transfer (OHT) which is an overhead traveling type conveyance device, an automated guided vehicle (AGV) and a rail guide vehicle (RGV) which are floor travelling type conveyance devices, and a person guided vehicle (PGV) which is a manual conveyance device may be used. The conveyance containers 1, which accommodate wafers subjected to a predetermined processing by the heat treatment unit 13, may be placed on the first carry-in/out table 111*a* or the second carry-in/out table 112*a*, and then carried out of the first carry-in/out table 111*a* or the second carry-in/out table 112*a* by the same unit to be conveyed to other processes.

In the vertical heat treatment apparatus 10 of the present exemplary embodiment, as described above, the second storage section 122 may be provided below the conveyance mechanism 124. Thus, a sufficient number of conveyance containers 1 accommodating wafers may be stored within the apparatus without increasing the footprint of the apparatus. However, in order to further improve the throughput of the apparatus, it may be required to dispose and store more conveyance containers 1 within the apparatus. Therefore, in order to secure a more space within the apparatus where the conveyance containers 1 are provided, the height of the conveyance storage unit 12 may be increased.

However, as described above, the vertical heat treatment apparatus 10 of the present exemplary embodiment is generally provided within a clean room, and thus its height may be restricted. Accordingly, when the apparatus is provided in a clean room of which height is not sufficiently secured, a recess may be formed on the bottom of an installation site so that a part of the vertical heat treatment apparatus may be installed in the recess.

As described above, as for the conveyance unit used for carrying-in/out of the conveyance containers 1, for example, the OHT, or the AGV and the RGV (floor travelling type conveyance devices) may be used. Accordingly, the distance between the bottom surface or the ceiling surface on which the conveyance unit for the conveyance containers 1 is disposed and a portion of the vertical heat treatment apparatus 10 which receives and discharges the conveyance containers 1 may fall within a predetermined range. That is, the carry-in/out unit 11 for receiving and discharging the conveyance containers 1 may be provided in a portion of the base surface of the clean room not formed with the recess.

Therefore, in the vertical heat treatment apparatus 10 of the present exemplary embodiment, the carry-in/out unit 11 may be provided at any position in the height direction of the conveyance storage unit 12 [the z-axis direction in FIG. 2A] so that the carry-in/out unit 11 is disposed outside the recess and the conveyance storage unit 12 is disposed inside the recess.

As described above, the carry-in/out unit 11 may include the first carry-in/out table 111a and the second carry-in/out table 112a disposed above the first carry-in/out table 111a. The conveyance containers 1 may be mounted on the first carry-in/out table 111a and carried into or out of the vertical heat treatment apparatus. The conveyance containers 1 may be mounted on the second carry-in/out table 112a, and carried into or out of the vertical heat treatment apparatus.

The distance from the lower end face (the bottom surface) 11a of the carry-in/out unit 11 to the top surface of the first carry-in/out table 111a may be about 890 mm so that the first carry-in/out table 111a disposed at the lower side may correspond to the floor travelling type conveyance device such an AGV or an RGV. As described above, even when the conveyance storage unit 12 is disposed at a position lower than the base surface of the clean room, the carry-in/out unit 11 may be disposed on the base surface of the clean room. Accordingly, the distance h1 between the surface of the first carry-in/out table 111a where the conveyance containers 1 are mounted and a lower end face 12a of the conveyance storage unit 12 may be 890 mm or more. In particular, the distance h1 between the surface of the first carry-in/out table 111a where the conveyance containers 1 are mounted and the lower end face 12a of the conveyance storage unit 12 may be 1363 mm or more so that the recess has a sufficient depth and the conveyance storage unit 12 has a sufficient height.

Meanwhile, when the carry-in/out unit 11 is excessively close to a ceiling surface of the clean room, it may be difficult to carry the conveyance containers 1 into the second carry-in/out table 112a by, for example, the OHT (an overhead traveling type conveyance device. Accordingly, it is preferable that the distance h2 between the top portion of each of the conveyance containers 1 disposed on the second carry-in/out table 112a and the lower end face 12a of the conveyance storage unit 12 is 2410 mm or less.

After manufactured, the vertical heat treatment apparatus 10 of the present exemplary embodiment is required to be conveyed to be installed in, for example, a factory. In general, the vertical heat treatment apparatus 10 is conveyed by a truck from a vertical heat treatment apparatus manufacturing factory to, for example, a factory to which the apparatus will be installed. However, in accordance with a road act, the height of a vehicle, including loaded luggage, is limited within 3800 mm unless a conveyance truck drives on a designated road. A truck has a loading space with a height of about 1000 mm even if the truck is a low-floor vehicle. Thus, the height of the loaded luggage may be 2800 mm or less. Accordingly, the vertical heat treatment apparatus 10 of the present exemplary embodiment may be configured to be divided into a plurality of members when its height is greater than 2800 mm.

As described above, the vertical heat treatment apparatus of the present exemplary embodiment may include the conveyance storage unit 12 and the heat treatment unit 13. The vertical heat treatment apparatus may further include the carry-in/out unit 11. Here, the height of each of the conveyance storage unit 12 and the heat treatment unit 13 may be greater than 2800 mm. Accordingly, these units may be divided into a plurality of members in the height direction [the z-axis direction in FIG. 2A].

For example, a housing of the conveyance storage unit 12 may be divided into a plurality of members. When the housing is divided, respective members within the unit may be disposed in the housing so as to further facilitate installation in, for example, a factory as a conveyance destination.

Accordingly, for example, the housing of the conveyance storage unit 12 may be divided along the dotted line a in FIG. 2A into two housing portions, that is, a housing portion including regions Y1 and Y2, and a housing portion including a region Y3.

Specifically, the housing of the conveyance storage unit 12 may include a first housing portion in which the first storage section 121 and the conveyance mechanism 124 are disposed, and a second housing portion below the first housing portion in which the second storage section 122 is disposed. The housing of the conveyance storage unit 12 may be divided into at least the first and second housing portions. In this case, the height of each of the first and second housing portions may be 2800 mm or less.

The housing may be further divided. For example, the first housing portion may be divided along the dotted line b into a housing portion including the region Y1 above the conveyance mechanism 124, and a housing portion including the region Y2. As described above, the height of each divided housing portion may be 2800 mm or less. Meanwhile, among the members of the conveyance storage unit 12, the conveyance mechanism 124 which is long in the height direction may not be further divided, and thus its height [the length in the z-axis direction in FIG. 2A] may be 2800 mm or less.

The heat treatment unit 13 also may be divided into a plurality of members. The heat treatment unit 13 may be divided into a housing portion including the heat treatment furnace area 131, and a housing portion including the loading area 132. In this case, the height of each divided housing portion may also be 2800 mm or less.

Meanwhile, in the vertical heat treatment apparatus of the present exemplary embodiment, as illustrated in FIG. 2A, a control unit 14 including, for example, a computer may be provided. The control unit 14 may include, for example, a program, a memory, and a data processing unit composed of a CPU. Commands (for respective steps) may be incorporated in the program so that control signals may be transmitted from the control unit to the respective units of the vertical heat treatment apparatus 10 to execute respective processings such as conveyance of the conveyance containers 1, transfer of wafers between the conveyance containers 1 and the holder 1321, and heat treatment of the heat treatment furnace 1311. The program may be stored in a computer storage medium such as, for example, a flexible disk, a compact disk, a hard disk, a MO (magneto-optical disk) and a memory card to be installed in the control unit.

In the above described vertical heat treatment apparatus in the present exemplary embodiment, the second storage section may be provided below the conveyance mechanism so that the apparatus is capable of storing a sufficient number of conveyance containers with the substantially same footprint as that of a conventional vertical heat treatment apparatus, the conveyance containers accommodating wafers with a diameter of 450 mm.

The configuration of the above described vertical heat treatment apparatus in the present exemplary embodiment particularly has an excellent effect as described above, in a case of the vertical heat treatment apparatus for processing wafers with a diameter of 450 mm. Therefore, the vertical heat treatment apparatus of the present exemplary embodiment may be configured to process wafers with a diameter of 450 mm. That is, the vertical heat treatment apparatus may use a conveyance container accommodating a plurality of wafers with a diameter of 450 mm. A vertical heat treatment apparatus configured to process wafers with a diameter of 300 mm may employ the configuration of the vertical heat treatment apparatus of the present exemplary embodiment so that more conveyance containers accommodating the wafers may be stored in the apparatus. Accordingly, the processing time may be reduced, and the throughput may be improved. Thus, the vertical heat treatment apparatus of the present exemplary embodiment is not limited to a vertical heat treatment apparatus for processing the wafers with a diameter of 450 mm, but may be applied to a vertical heat treatment apparatus for processing the wafers with a diameter of 300 mm, that is, a vertical heat treatment apparatus which uses a conveyance container accommodating a plurality of wafers with a diameter of 300 mm.

Hereinafter, an exemplary configuration of a method of installing a substrate heat treatment apparatus will be described. Here, a vertical heat treatment apparatus is illustrated as an example, but the present disclosure is not limited thereto.

As described above, in the above-described vertical heat treatment apparatus, a recess may be formed on the base surface of a clean room, and a part of the vertical heat treatment apparatus may be installed in the recess. Descriptions will be made on the exemplary configuration of a method of installing the vertical heat treatment apparatus in a case where the recess is formed on the base surface of the clean room as described above.

In FIG. 2A, it is assumed that the dotted line a corresponds to a base surface of the clean room, and the recess is formed to a depth indicated by the dotted line c in the place where the conveyance storage unit 12 and the heat treatment unit 13 are provided. In this case, the conveyance storage unit 12 and the heat treatment unit 13 may be installed at corresponding locations within the recess. However, in general, the apparatus may be tightly installed within the clean room. Thus, it may be difficult to install respective units which are completely assembled. The recess is formed because the vertical heat treatment apparatus is mostly not fit to the height of the clean room. Thus, in most cases, the apparatus in a completely assembled state may not be installed.

Accordingly, for example, the housing of the conveyance storage unit 12 or the heat treatment unit 13 may be configured to be divided into a plurality of members in the height direction [the z-axis direction in FIG. 2A] as described above. Then, the respective divided housing portions may be assembled and installed in the recess.

Here, at first, a method of installing, for example, a portion of the conveyance storage unit 12 will be described.

The conveyance storage unit 12 may be divided along the dotted line a in the drawing into a first housing portion in which the first storage section 121 and the conveyance mechanism 124 are disposed, and a second housing portion below the first housing portion in which the second storage section 122 is disposed. Here, the housing of the conveyance storage unit 12 may be configured to be divided into at least the first housing portion and the second housing portion.

The vertical heat treatment apparatus installation method may include: forming a recess on the base surface, and installing the second housing portion within the recess; and installing the first housing portion above the second housing portion.

Meanwhile, the depth of the recess and the height of the second housing portion do not need to be the same. For example, the height of the second housing portion may be higher or lower than the depth of the recess. As described above, the first housing portion may be configured to be further divided. In this case, a process of installing all the divided housing portions may be performed.

Also, the housing of the heat treatment unit 13 may be configured to be divided for the heat treatment furnace area 131 and the loading area 132. In the vertical heat treatment apparatus installation method of the present exemplary embodiment, the installation of the heat treatment unit 13 may include: installing a housing portion including the loading area 132; and installing a housing portion including the heat treatment furnace area 131 above the housing portion including the loading area 132.

Processes of installing a plurality of units may be performed in combination before assembly for each unit is completed. Specifically, for example, a process of installing the second housing portion of the conveyance storage unit 12 may be performed first, and then, a process of installing the housing portion of the heat treatment unit 13 which includes the loading area 132 may be performed. Subsequently, the first housing portion and the housing portion including the heat treatment furnace area may be installed above the second housing portion of the conveyance storage unit 12, and the housing portion of the heat treatment unit 13 which includes the loading area 132, respectively.

As described above, the installation method of the vertical heat treatment apparatus of the present exemplary embodiment has been described. According to this installation method, the vertical heat treatment apparatus may be easily installed even in a place formed with a recess on the base surface thereof, such as a clean room.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate heat treatment apparatus, comprising:
a conveyance storage unit including a first storage section and a second storage section each configured to store a plurality of conveyance containers, and a conveyance mechanism provided within the conveyance storage unit to be extended in a vertical direction and configured to convey the conveyance containers while moving in the vertical direction and being rotated, each of the conveyance containers being configured to accommodate a plurality of wafers;
a carry-in/out unit provided to be attached to the conveyance storage unit from one side of the conveyance storage unit and configured to dispose the conveyance containers such that the conveyance containers are carried into or out of the conveyance storage unit by the conveyance mechanism;
a heat treatment unit provided to be attached to the conveyance storage unit from another side of the conveyance storage unit opposite to the one side and including a heat treatment furnace configured to accommodate a holder configured to hold the plurality of wafers in multiple stages, and to perform the heat treatment on the wafers; and
a transfer section including a mounting stage disposed in a wall of the conveyance storage unit facing the heat treatment unit and below the first storage section, the mounting stage being configured to mount each of the conveyance containers thereon to allow the wafers in each of the conveyance containers to be transferred to the holder of the heat treatment unit,
wherein the first storage section of the conveyance storage unit is disposed in the wall of the conveyance storage unit facing the heat treatment unit, and the second storage section is disposed below the conveyance mechanism and adjacent to the mounting stage, and
the second storage section includes an elevating mechanism configured to change a height of each of the conveyance containers stored in the second storage section in the vertical direction.

2. The substrate heat treatment apparatus of claim 1, wherein the elevating mechanism includes:
a conveyance container support configured to support the conveyance containers;
a position displacement member configured to displace a vertical position of the conveyance container support; and
a guide member configured to guide a vertical movement of the conveyance container support.

3. The substrate heat treatment apparatus of claim 2, wherein the position displacement member includes a ball screw.

4. The substrate heat treatment apparatus of claim 1, wherein
the elevating mechanism includes a conveyance container support configured to support the conveyance containers, and
a distance between the conveyance container support and a lower end surface of the elevating mechanism when the conveyance container support is located at a highest position is 1.2 or more times a distance between the conveyance container support and the lower end surface of the elevating mechanism when the conveyance container support is located at a lowest position.

5. The substrate heat treatment apparatus of claim 1, wherein the elevating mechanism is configured to elevate a load of 50 kg or more.

6. The substrate heat treatment apparatus of claim 1, wherein the conveyance mechanism is configured to hold the conveyance containers from a top side thereof to convey the conveyance containers.

7. The substrate heat treatment apparatus of claim 1, wherein the carry-in/out unit includes: a first carry-in/out table and a second carry-in/out table disposed above the first carry-in/out table, the conveyance containers being mounted on the first carry-in/out table to be carried into or out of the substrate heat treatment apparatus, and the conveyance containers being mounted on the second carry-in/out table to be carried into or out of the substrate heat treatment apparatus, and
a distance between a conveyance container mounting surface of the first carry-in/out table and a lower end face of the conveyance storage unit is 890 mm or more.

8. The substrate heat treatment apparatus of claim 1, wherein
the conveyance storage unit includes a housing including a first housing portion in which the first storage section and the conveyance mechanism are disposed, and a second housing portion below the first housing portion in which the second storage section is disposed, and
the housing of the conveyance storage unit is configured to be divided into at least the first housing portion and the second housing portion.

9. The substrate heat treatment apparatus of claim 1, wherein the first storage section includes a plurality of stages of mounting shelves.

10. The substrate heat treatment apparatus of claim 9, wherein the conveyance mechanism is extended along the plurality of stages of mounting shelves all the way.

11. The substrate heat treatment apparatus of claim 1, wherein the first storage section is arranged on a wall portion of the conveyance storage unit facing the heat treatment unit.

12. A method of installing the substrate heat treatment apparatus of claim 8, the method comprising:
forming a recess on a base surface;
installing the second housing portion within the recess; and
installing the first housing portion above the second housing portion.

* * * * *